(12) United States Patent
Zhang et al.

(10) Patent No.: US 11,164,967 B2
(45) Date of Patent: Nov. 2, 2021

(54) POWER SILICON CARBIDE BASED MOSFET TRANSISTORS WITH IMPROVED SHORT CIRCUIT CAPABILITIES AND METHODS OF MAKING SUCH DEVICES

(71) Applicant: Cree, Inc., Durham, NC (US)

(72) Inventors: Qingchun Zhang, Cary, NC (US); Alexander V. Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 16 days.

(21) Appl. No.: 16/538,229

(22) Filed: Aug. 12, 2019

(65) Prior Publication Data

US 2019/0371931 A1 Dec. 5, 2019

Related U.S. Application Data

(62) Division of application No. 15/849,975, filed on Dec. 21, 2017, now Pat. No. 10,424,660.

(51) Int. Cl.
| | |
|---|---|
| *H01L 29/78* | (2006.01) |
| *H01L 29/16* | (2006.01) |
| *H01L 21/265* | (2006.01) |
| *H01L 29/08* | (2006.01) |
| *H01L 29/10* | (2006.01) |
| *H01L 29/66* | (2006.01) |
| *H01L 29/06* | (2006.01) |
| *H01L 21/04* | (2006.01) |

(52) U.S. Cl.
CPC ........ *H01L 29/7802* (2013.01); *H01L 21/047* (2013.01); *H01L 21/26513* (2013.01); *H01L 29/0646* (2013.01); *H01L 29/0696* (2013.01); *H01L 29/086* (2013.01); *H01L 29/105* (2013.01); *H01L 29/1608* (2013.01); *H01L 29/66068* (2013.01); *H01L 29/7828* (2013.01)

(58) Field of Classification Search
None
See application file for complete search history.

(56) References Cited

U.S. PATENT DOCUMENTS

| | | |
|---|---|---|
| 5,780,878 A | 7/1998 | Mohit et al. |
| 6,096,607 A | 8/2000 | Katsunori |
| (Continued) | | |

FOREIGN PATENT DOCUMENTS

WO 2010098076 9/2010

OTHER PUBLICATIONS

R. K. Chilukuri et al., "High Temperature Operation of SiC Planar ACCUFET", IEEE Transactions on Industry Applications, Dec. 31, 1999, pp. 1458-1462.

(Continued)

*Primary Examiner* — Long Pham
(74) *Attorney, Agent, or Firm* — Myers Bigel, P.A.

(57) ABSTRACT

A power MOSFET includes a silicon carbide drift region having a first conductivity type, first and second well regions located in upper portions of the silicon carbide drift region that are doped with second conductivity dopants, and a channel region in a side portion of the first well region, an upper portion of the channel region having the first conductivity type, wherein a depth of the first well region is at least 1.5 microns and the depth of the first well region exceeds a distance between the first and second well regions.

20 Claims, 9 Drawing Sheets

(56) References Cited

U.S. PATENT DOCUMENTS

| | | |
|---|---|---|
| 2012/0261715 A1 | 10/2012 | Jin-Myung et al. |
| 2015/0028350 A1 | 1/2015 | Alexander et al. |
| 2016/0197163 A1 | 7/2016 | Yasushi et al. |
| 2017/0345891 A1 | 11/2017 | Van Brunt et al. |
| 2018/0145168 A1* | 5/2018 | Konstantinov ..... H01L 29/1608 |

OTHER PUBLICATIONS

Notification of Transmittal of the International Search Report and the Written Opinion of the International Searching Authority, or the Declaration, corresponding to International Application No. PCT/US2018/057933, dated Feb. 5, 2019.

* cited by examiner

POWER SILICON CARBIDE BASED MOSFET TRANSISTORS WITH IMPROVED SHORT CIRCUIT CAPABILITIES AND METHODS OF MAKING SUCH DEVICES

CROSS-REFERENCE TO RELATED APPLICATION

This application is a divisional application of and claims priority from U.S. patent application Ser. No. 15/849,975, filed Dec. 21, 2017, the disclosure of which is hereby incorporated herein by reference in its entirety as if set forth fully herein.

STATEMENT OF U.S. GOVERNMENT INTEREST

This invention was made with Government support under Contract No. W911NF-12-2-0064 awarded by the Army Research Lab. The Government has certain rights in the invention.

FIELD

The present invention relates to semiconductor devices and, more particularly, to power semiconductor transistors.

BACKGROUND

The Metal Oxide Semiconductor Field Effect Transistor ("MOSFET") is a well known type of semiconductor transistor that may be used as a switching device. A MOSFET is a three terminal device that includes a source region and a drain region that are separated by a channel region, and a gate electrode that is disposed adjacent the channel region. A MOSFET may be turned on or off by applying a gate bias voltage to the gate electrode. When a MOSFET is turned on by application of a gate bias voltage that is greater than or equal to a threshold voltage, current is conducted through the channel region of the MOSFET between the source region and the drain region. When the bias voltage is removed from the gate electrode (or reduced below the threshold voltage level), the current ceases to conduct through the channel region. By way of example, an n-type MOSFET has n-type source and drain regions and a p-type channel. An n-type MOSFET may be designed to turn on when a gate bias voltage is applied to the gate electrode that is sufficient to create a conductive n-type inversion layer in the p-type channel region that electrically connects the n-type source and drain regions, thereby allowing for majority carrier conduction therebetween. MOSFETs may also be designed as "normally-on" devices that are turned off by application of a gate bias voltage to the gate electrode.

The gate electrode of a MOSFET is typically separated from the channel region by a thin gate insulating pattern, such as a silicon oxide pattern. Because the gate electrode of the MOSFET is insulated from the channel region by the gate insulating pattern, minimal gate current is required to maintain the MOSFET in its on-state or to switch the MOSFET between its on-state and its off-state. The gate current is kept small during switching because the gate forms a capacitor with the channel region. Thus, only minimal charging and discharging current is required during switching, allowing for less complex gate drive circuitry.

There is an increasing demand for high power MOSFETs that can pass large currents (e.g., tens of Amps or more) in their "on" state and block large voltages (e.g., hundreds or even thousands of volts) in their reverse blocking state. In order to support high current densities and block such high voltages, power MOSFETs typically have a vertical structure with the source and drain on opposite sides of a thick semiconductor layer structure. In very high power applications, power MOSFETs are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed in other semiconductor materials such as, for example, silicon, electronic devices formed in silicon carbide may have the capability of operating at higher temperatures, at high power densities, at higher speeds, at higher power levels and/or under higher radiation densities.

SUMMARY

Pursuant to some embodiments of the present invention, power MOSFETs are provided that include a silicon carbide drift region having a first conductivity type. A first well region is located in an upper portion of the silicon carbide drift region that extends to an upper surface of the silicon carbide drift region. The first well region is doped with second conductivity dopants and at least a lower portion of the first well region has a second conductivity type that is different than the first conductivity type. A second well region is located in the upper portion of the silicon carbide drift region that extends to the upper surface of the silicon carbide drift region. The second well region is spaced apart from the first well region by a JFET region of the silicon carbide drift layer. The second well region is doped with second conductivity dopants and at least a lower portion of the second well region has the second conductivity type. A channel region is provided in a side portion of the first well region, an upper portion of the channel region having the first conductivity type. A depth of the first well region is at least 1.5 microns and the depth of the first well region exceeds a distance between the first and second well regions.

In some embodiments, the power MOSFETs further include
a first source/drain contact on a lower surface of the silicon carbide drift region, a first conductivity type region in an upper portion of the first well region and extending to an upper surface of the first well region, a second source/drain contact on an upper surface of the first conductivity type region, a gate insulating layer on the first well region; and a gate electrode on the gate insulating layer.

In some embodiments, the first and second well regions may be implanted regions that are implanted with the second conductivity type dopants.

In some embodiments, a doping concentration of the JFET region is between $1 \times 10^{16}$ cm$^3$ and $5 \times 10^{17}$/cm$^3$.

In some embodiments, at least the upper 0.2 microns of the first well region has the first conductivity type. In other embodiments, at least the upper 0.4 microns of the first well region has the first conductivity type.

In some embodiments, the first and second well regions may each have a depth of at least 2.5 microns.

In some embodiments, the channel region and a central portion of the first well region may have substantially the same doping profile of second conductivity type dopants as a function of depth from the upper surface of the silicon carbide drift region.

In some embodiments, a concentration of second conductivity type dopants in the first well region may vary by less than a factor of three at depths between 1.0 and 2.0 microns from the upper surface of the silicon carbide drift region In some embodiments, wherein a lower portion of the channel region may have the second conductivity type.

In some embodiments, the power MOSFET may exhibit a negative temperature coefficient for the drain current for at least temperatures in the range of 25-150° C. at drain-source currents of less than 40 Amps.

Pursuant to further embodiments of the present invention, power MOSFETs are provided that include a silicon carbide drift region having a first conductivity type, a first well region located in an upper portion of the silicon carbide drift region and extending to an upper surface of the silicon carbide drift region, the first well region doped with second conductivity dopants and at least a lower portion of the first well region having a second conductivity type, where the second conductivity type is different than the first conductivity type, a gate insulating layer on the upper surface of the first well region and a channel region under the gate insulating layer in a side portion of the first well region, an upper portion of the channel region having the first conductivity type. These MOSFETs may exhibit a negative temperature coefficient for the drain current for at least temperatures in the range of 25-150° C. at drain-source currents of less than 40 Amps.

In some embodiments, a depth of the first well region may be at least 1.5 microns and the depth of the first well region may exceed a distance between the first well region and a second well region that is adjacent the first well region. The first and second well regions may be formed using a channeled ion implantation.

Pursuant to further embodiments of the present invention, methods of forming a power MOSFET are provided in which a silicon carbide drift region having a first conductivity type is formed on a substrate. First and second well regions are formed in upper portions of the silicon carbide drift region by implanting second conductivity type dopants into upper portion of the silicon carbide drift region using a channeled ion implantation. An upper portion of each of the first and second well regions has the first conductivity type while a lower portion of each of the first and second well regions has the second conductivity type, the second conductivity type being different than the first conductivity type.

In some embodiments, the channeled ion implantation may implant dopant impurities at an angle that is within +/−1.5° of one of the <0001>, <11-23>, <-1-123>, <1-213>, <-12-13>, <2-1-13> or <-2113> crystallographic axes of the silicon carbide drift region.

In some embodiments, the first and second well regions may each have a depth of at least 1.5 microns (or at least 2.5 microns) and at least the upper 0.2 microns (or 0.4 microns) of the first well region may have the first conductivity type.

In some embodiments, the depth of the first well region may exceed a distance between the first and second well regions.

In some embodiments, a side portion of the first well region that is underneath a gate electrode of the MOSFET comprises a channel region, and at least a portion of the channel region may have the first conductivity type.

In some embodiments, the channel region and a central portion of the first well region may have substantially the same doping profile of second conductivity type dopants as a function of depth from the upper surface of the silicon carbide drift region.

DETAILED DESCRIPTION

Power silicon carbide MOSFETs are in use today for applications requiring high voltage blocking such as voltage blocking of 1,000 volts or more. By way of example, silicon carbide MOSFETs are commercially available that are rated for current densities of 10 A/cm$^2$ or more that will block voltages of at least 10 kV. To form such devices, a plurality of "unit cell" MOSFET transistors are typically formed that are electrically connected in parallel. In high power applications, a large number of these unit cells (e.g., hundreds or thousands) are typically provided on a single semiconductor substrate, and a gate electrode pattern is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure that are exposed within openings in the gate electrode pattern. These source contacts are also electrically connected to each other to serve as a common source. The resulting device has three terminals, namely a common source terminal, a common drain terminal and a common gate electrode that act as the terminals for the hundreds or thousands of individual unit cell transistors. It will be appreciated that the above description is of an n-type MOSFET; the locations of the drain and source would be reversed for a p-type MOSFET.

There is continued demand to reduce both the cost and size of power MOSFET devices, while providing similar or improved performance. Several important performance parameters are the mobility of the carriers in the channel region of the MOSFET, the threshold voltage of the device and the "short circuit capability" of the device.

Figure 1A:
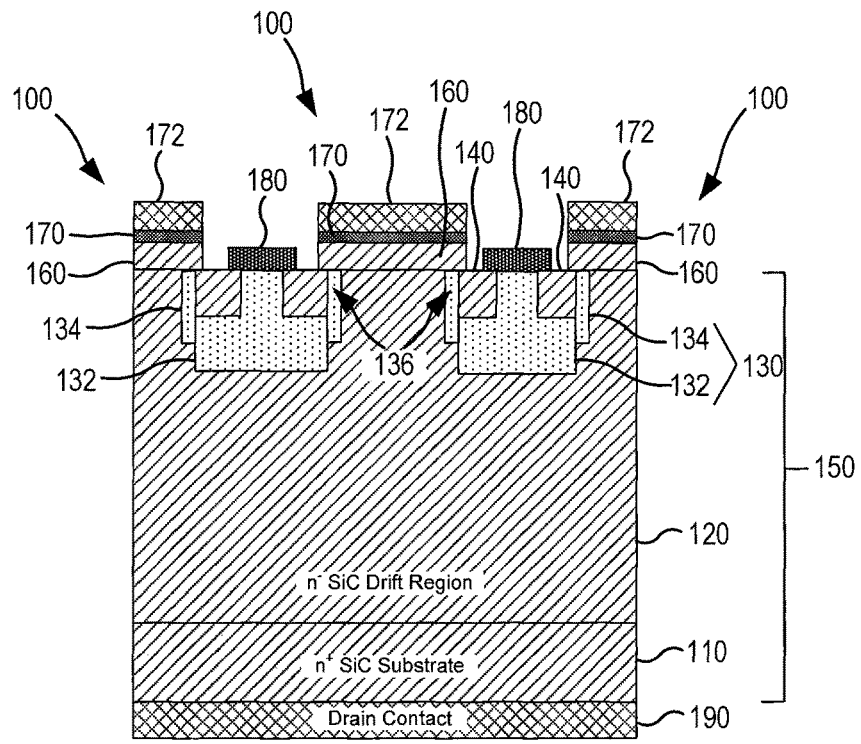
FIG. 1A is a schematic cross-sectional view of a unit cell of a conventional power MOSFET.
Figure 1B:
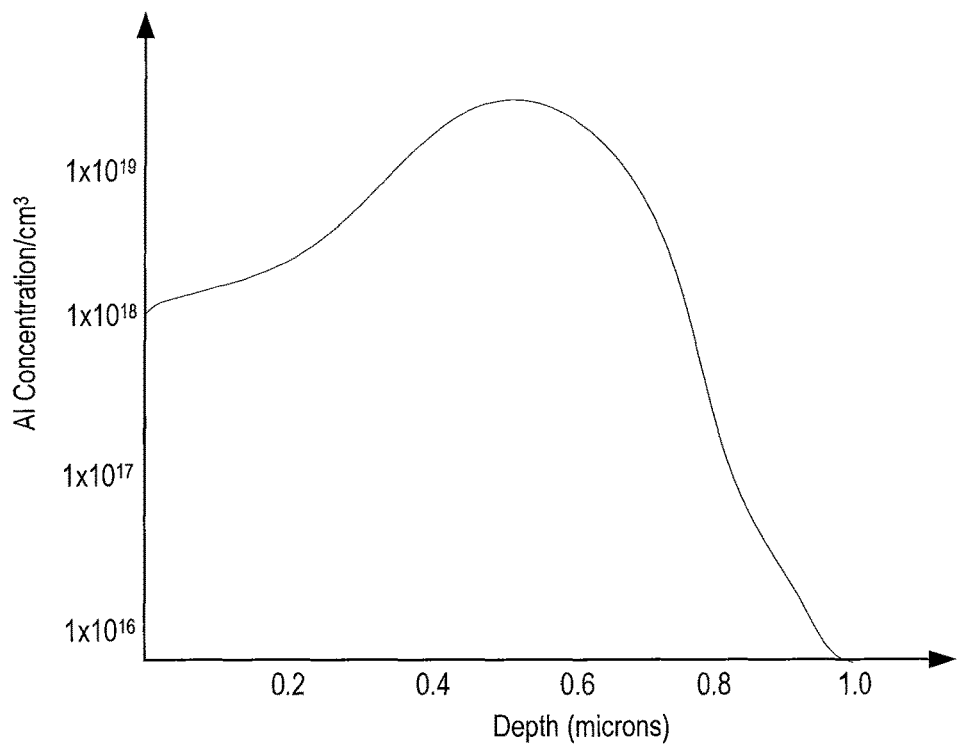
FIG. 1B is a graph showing the doping profile of the channel regions of the unit cell of FIG. 1A as a function of depth.

FIG. 1A is a schematic cross-sectional view of a unit cell transistor 100 of a conventional silicon carbide power MOSFET (FIG. 1A also shows portions of two adjacent unit cells 100). FIG. 1B is a graph showing the doping profile of a side p-well of the unit cell transistor 100 as a function of depth from a top surface of a semiconductor layer structure of the device.

As shown in FIG. 1A, the unit cell transistor 100 may be formed on an n-type silicon carbide semiconductor substrate 110. The substrate 110 may comprise, for example, a single crystal 4H silicon carbide semiconductor substrate that is heavily-doped with n-type impurities (i.e., an n+silicon carbide substrate).

A lightly-doped n-type (n−) silicon carbide drift region 120 is provided on the substrate 110. Upper portions of the n-type silicon carbide drift region 120 may be doped p-type by ion implantation to form p-wells 130. Each p-well 130 may include a main p-well 132 and a pair of side p-wells 134. The main p-wells 132 have a doping concentration of, for example, between $5 \times 10^{18}/cm^3$ and $5 \times 10^{19}/cm^3$. The dopant concentration is generally higher the deeper the p-well 132 extends into the silicon carbide drift region 120. The side p-wells 134 are more lightly doped with p-type dopants than the main p-wells 132. The doping concentration profile of each side p-well 134 is shown in FIG. 1B, which is discussed below. Each p-well 130 is formed by ion implantation using two ion implantation steps. As known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer. The ions will implant at different depths into the semiconductor layer so that the predetermined kinetic energy will provide an implant "profile" with varying ion concentrations as a function of depth.

Heavily-doped (n+) n-type silicon carbide source regions 140 are formed in upper portions of the p-wells 130. The n-type source regions 140 may be formed by ion implantation. The heavily-doped (n+) n-type silicon carbide regions 140 act as source regions for the unit cell transistor 100. The drift region 120 and the substrate 110 together act as a common drain region for the unit cell transistor 100. The n-type silicon carbide substrate 110, n-type silicon carbide drift region 120, the p-wells 130 and the n-type source regions 140 formed therein may together comprise a semiconductor layer structure 150 of the unit cell transistor 100.

After the p-wells 130 and the n-type source regions 140 are formed, an n-type epitaxial pattern 160 may be grown on the semiconductor layer structure 150. The n-type epitaxial pattern 160 may have a low doping density (e.g., between $1 \times 10^{16}/cm^3$ and $1 \times 10^{17}/cm^3$). The n-type epitaxial pattern 160 may be, for example, 0.5 to 1.5 microns thick.

A gate insulating pattern 170 may be formed on the upper surface of the n-type epitaxial pattern 160. The gate insulating pattern 170 may comprise, for example, a silicon oxide layer, although other insulating materials may be used. A gate electrode 172 is formed on the gate insulating pattern 170 opposite the n-type epitaxial pattern 160. Source contacts 180 may be formed within openings in the n-type epitaxial layer 160 that expose the heavily-doped n-type source regions 140. A drain contact 190 may be formed on the lower surface of the substrate 110.

Channel regions 136 are formed in the side portions of p-wells 130. The channel regions 136 may extend into the n-type epitaxial pattern 160. The channel regions 136 electrically connect the n-type source regions 140 to the drift region 120 when a sufficient bias voltage is applied to the gate electrode 172. When such a bias voltage is applied to the gate electrode 172, current may flow from the n-type source regions 140 through the channel regions 136 to the portion of the drift region 120 that is underneath the gate electrode 172.

While the unit cell transistor 100 is an n-type device with the source contacts 180 on an upper surface thereof and the drain contact 190 on the bottom surface thereof, it will be appreciated that in p-type devices these locations are reversed. Accordingly, in portions of the descriptions below (including the claims) the source contacts and drain contacts may be generically referred to as "source/drain contacts," which term generically refers to either a source contact or a drain contact.

FIG. 1B is a graph showing the doping profile of the side p-well 134 of the unit cell transistor 100 as a function of depth from the upper surface of the semiconductor layer structure 150. In this example the p-wells 130 are formed by implanting aluminum ions into the silicon carbide drift layer 120. As shown in FIG. 1B, the side p-well 134 may have a graded doping profile with a doping density of aluminum ions is about $1 \times 10^{18}/cm^3$ at the upper surface of the side p-well 134, which then increases to about $5 \times 10^{19}/cm^3$ at a depth of about 0.5 microns from the n-type epitaxial pattern 160 and then gradually decreases thereafter. The side p-wells 134 may be implanted using a relatively low implantation energy (e.g., 300-350 keV) since a relatively high doping concentration is provided at the surface of the side p-wells 134.

As noted above, two important performance parameters for a power MOSFET may be the mobility of the carriers in the channel regions of the unit cell transistors and the threshold voltage of the device. The doping profile of the channel regions 136 may have a significant impact on both of these performance parameters. In order to have high channel mobility it may be desirable to have a low doping density directly under the gate insulating layer 170. Having the upper portion of the channel region 136 that is directly under the gate insulating layer 170 be an n-type region (in a p-channel MOSFET) may also improve channel mobility. Such a design also results in a low threshold voltage. Additionally, since the ion implantation damage will not be directly under the gate insulating layer 170, the damage caused by such ion implantation is farther removed from the gate insulating layer 170 and hence may have less impact on device performance.

A MOSFET that is formed of the unit cell transistors 100 may exhibit good performance. However, the MOSFET may be expensive to make as it requires growing a first set of semiconductor layers, removing the structure from the growth reactor to form the p-wells 130 and n-type source regions 140 via ion implantation, and then placing the structure back into the growth reactor to form the n-type epitaxial pattern 160.

Figure 2A:
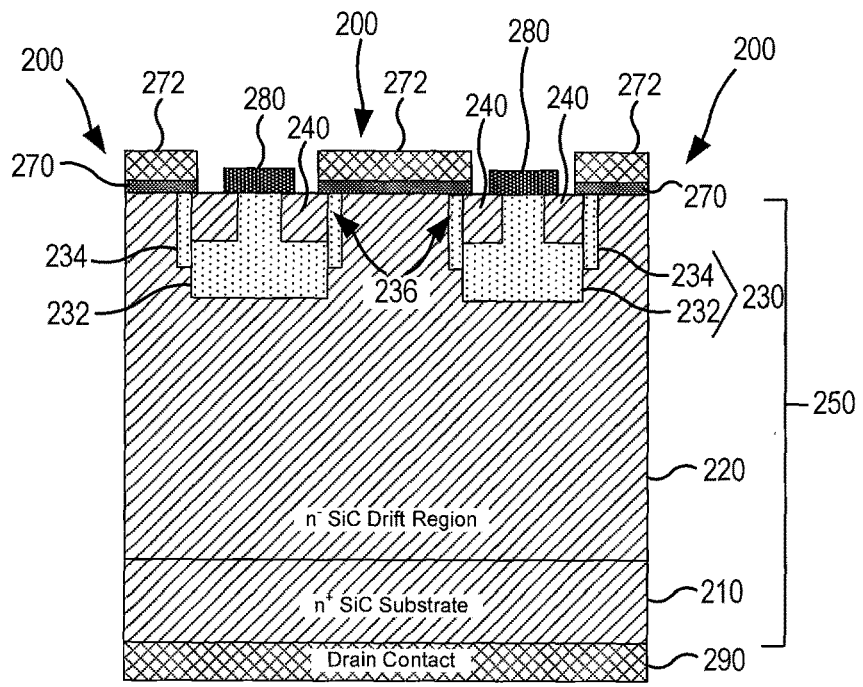
FIG. 2A is a schematic cross-sectional view of a unit cell of another conventional power MOSFET.

FIG. 2A is a schematic cross-sectional view of a unit cell 200) and portions of two additional unit cells 200) of another conventional silicon carbide power MOSFET. As shown in FIG. 2A, the unit cell transistor 200 includes an n-type silicon carbide semiconductor substrate 210 and a lightly-doped n-type (n⁻) silicon carbide drift region 220 that is provided on an upper surface of the substrate 210. Upper portions of the n-type silicon carbide drift region 220 are doped p-type by ion implantation to form p-wells 230 that each comprise a main p-well 232 and a pair of side p-wells 234. Heavily-doped (n⁺) n-type silicon carbide source regions 240 are formed by ion implantation in upper portions of the p-wells 230. The substrate 210, drift region 220, p-wells 230 and n source regions 240 may together comprise a semiconductor layer structure 250 of the unit cell transistor 200. A gate insulating pattern 270 is formed on the semiconductor layer structure 250. A gate electrode 272 is formed on the gate insulating pattern 270. Source contacts 280 are formed on the source regions 240, and a drain contact 290 is formed on the lower surface of the substrate 210. Channel regions 236 are provided in the side portions of p-wells 230 that electrically connect the source regions 240 to the drift region 220 when a sufficient bias voltage is applied to the gate electrode 272.

As can be seen by comparing FIGS. 1A and 2A, the unit cell transistor 200 has a structure that is similar to the structure of the unit cell transistor 100 of FIG. 1A, except that the n-type epitaxial pattern 160 of unit cell transistor 100 is omitted in unit cell transistor 200. Accordingly, further description of the cross-sectional view of FIG. 2A will be omitted. It will also be appreciated that the dimensions and doping densities of various of the regions of unit cell transistor 200 may differ from the dimensions and doping densities of the corresponding regions in unit cell transistor 100.

Figure 2B:
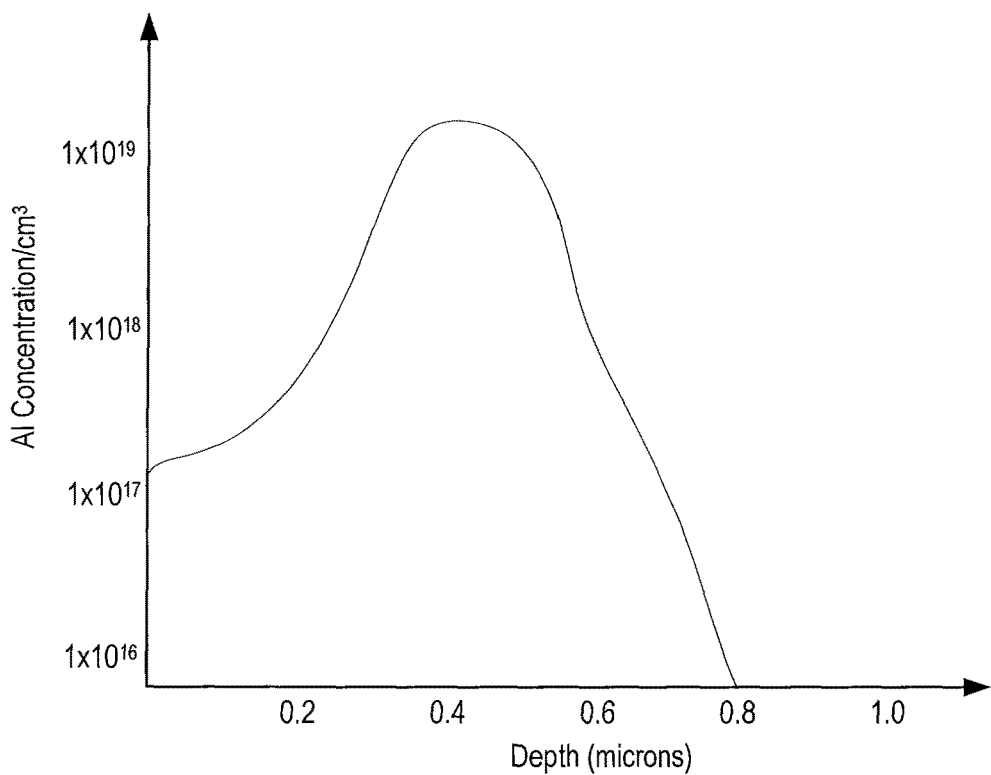
FIG. 2B is a graph showing the doping profile of the channel regions of the unit cell of FIG. 2A as a function of depth.

FIG. 2B is a graph showing the doping profile of the side p-well 234 of the unit cell transistor 200 as a function of depth from the upper surface of the semiconductor layer structure 250. As shown in FIG. 2B, the dopant concentration at the surface of the channel region 246 is about $1\times10^{17}/cm^3$. The dopant concentration increases to a peak doping concentration of about $1\times10^{19}/cm^3$ at a depth of about 0.5 microns from the gate insulating layer 270. The doping concentration then decreases, falling below $1\times10^{17}/cm^3$ at a depth of about 0.7 microns.

A power MOSFET formed of the unit cell transistors 200 may exhibit good performance, although the performance may not be as good as the performance of a power MOSFET formed of the unit cell transistors 100 of FIG. 1A. A drop-off in performance may result for the power MOSFET formed of the unit cell transistors 200 because the p-wells 230 may be formed via a higher energy ion implantation process (e.g., the implantation energy may be about 450 keV), which may result in increased damage to the semiconductor layer structure. In addition, this damage may be immediately underneath the gate insulating layer 270 where damage may have the greatest impact on device performance. In addition, the doping profile of FIG. 2B may be inferior to the doping profile of FIG. 1B and a corresponding reduction in performance may result. However, the power MOSFET formed of the unit cell transistors 200 may be significantly less expensive to fabricate as compared to the power MOSFET formed of the unit cell transistors 100.

Another potential issue with a power MOSFET formed of the unit cell transistors 200 is that it may exhibit reduced "short circuit capability" as compared to the power MOSFET formed of the unit cell transistors 100. The "short circuit capability" of a power MOSFET refers to the time that the power MOSFET can operate at a specified temperature without damaging the device. Under so-called short circuit conditions the temperature of a power MOSFET may increase dramatically because of the large amount of power dissipated in the device when a high current passes through the device. The short circuit capability of a power MOSFET may be important because characteristics of the device and its packaging will determine the amount that the MOSFET heats up as a function of operating power. For example, if the power MOSFET 200 conducts 500 amps at a voltage of 1200 volts, the power is 1200V*500A=60 kilowatts. A power MOSFET with typical packaging may have a thermal impedance of, for example, 0.01° C./W. Thus, for such a MOSFET, operation at 60 kilowatts will heat the device up to about 600° C. (60 kilowatts*0.01° C./W=600° C.). Typically, a MOSFET may only sustain such temperatures without failing for a very short period of time such as, for example, 1 microsecond. In contrast, the same MOSFET might be able to operate at 200° C. for ten hours without failing.

In order to protect a MOSFET against such failure, a control circuit may be provided that senses when a short circuit condition is occurring and lowers the gate voltage (e.g., to 0 volts) in response thereto. The short circuit condition is not a normal operating condition and typically occurs because a larger system that includes the MOSFET is not operating as intended. The short circuit capability of a MOSFET is important, however, because when a short circuit condition occurs the control system must be able to shut off the gate voltage quickly to prevent failure of the device. The shorter the duration of the short circuit capability the faster the control circuit must be able to operate.

Pursuant to embodiments of the present invention, power MOSFETs are provided that may exhibit significantly improved short circuit capability while still providing very high levels of performance in terms of blocking voltage, switching time and threshold voltage. This improved performance may be achieved by using channeled ion implantation techniques to form deep p-well regions in the semiconductor structure using relatively low implantation energies.

In some embodiments, power MOSFETs are provided that include a silicon carbide drift region having a first conductivity type, first and second well regions located in upper portions of the silicon carbide drift region that are doped with second conductivity dopants, and a channel region in a side portion of the first well region that includes an upper portion having the first conductivity type and a lower portion underneath the upper portion that has the second conductivity type, wherein a depth of the first well region is at least 1.5 microns and the depth of the first well region exceeds a distance between the first and second well regions. The first and second well regions may be implanted regions that are implanted with the second conductivity type dopants, and may be formed using channeled ion implantation.

In other embodiments, power MOSFETs are provided that include a silicon carbide drift region having a first conductivity type, first and second spaced-apart well regions located in respective upper portions of the silicon carbide drift region and extending to an upper surface of the silicon carbide drift region, the well regions doped with second conductivity dopants and at least a lower portion of each of the first and second well regions having a second conductivity type, where the second conductivity type is different than the first conductivity type, the first and second well regions defining a JFET region therebetween, a gate insulating layer on the upper surface of the first well region and a channel region under the gate insulating layer in a side portion of the first well region, an upper portion of the channel region having the first conductivity type. A doping density of the silicon carbide drift region, a width of the JFET region, a doping density the channel region of and/or a depth of the first well region selected to produce a negative temperature coefficient for the drain current for at least temperatures in the range of 25-150° C. at drain-source currents of less than 40 Amps.

Pursuant to still further embodiments of the present invention, methods of forming power MOSFETs are provided in which a silicon carbide drift region having a first conductivity type is formed on a substrate. First and second well regions are formed in upper portions of the silicon carbide drift region by implanting second conductivity type dopants into upper portion of the silicon carbide drift region using a channeled ion implantation. An upper portion of each of the first and second well regions has the first conductivity type while a lower portion of each of the first and second well regions has the second conductivity type, the second conductivity type being different than the first conductivity type.

Example embodiments of power MOSFETs according to embodiments of the present invention will now be described with reference to FIGS. 3-10.

Figure 3:
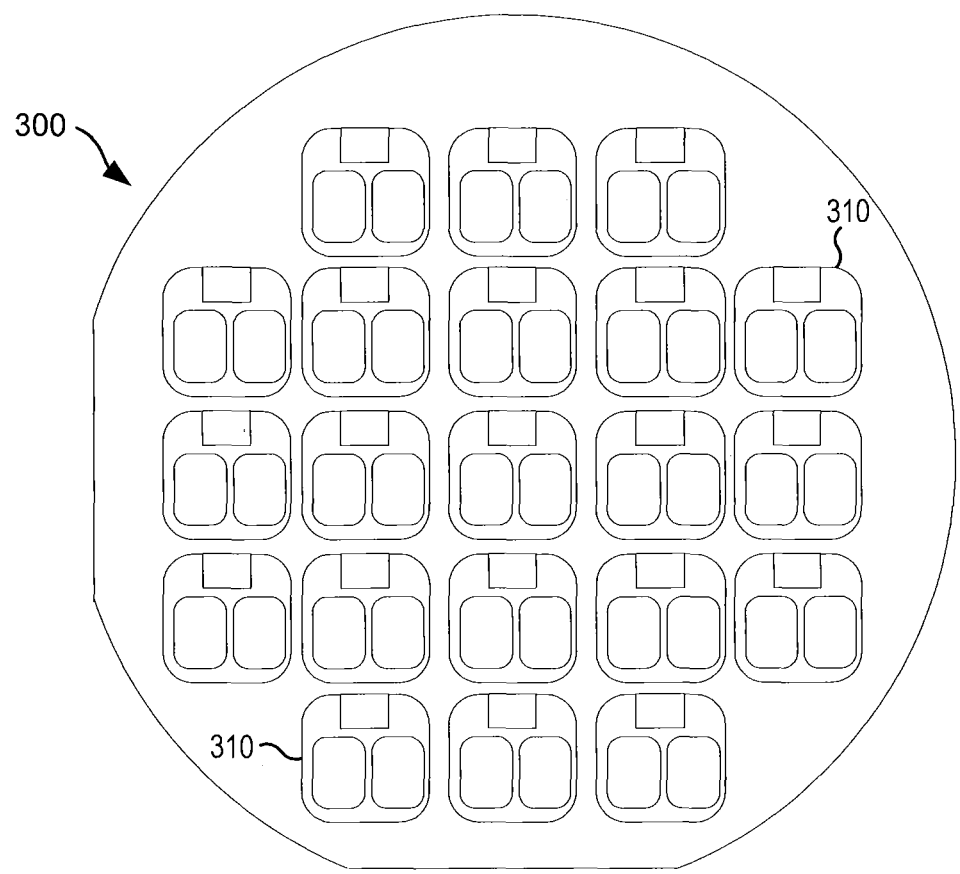
FIG. 3 is a schematic plan view of a semiconductor wafer that includes a plurality of power MOSFETs according to embodiments of the present invention.

FIG. 3 is a schematic plan view of a wafer 300 that includes a plurality of the power MOSFETs 310 according to embodiments of the present invention. The power MOSFETs 310 may be formed in rows and columns and may be spaced apart from each other so that the wafer 300 may later be singulated (e.g., diced) to separate the individual power MOSFETs 310 for packaging and testing. The wafer 300 may comprise, for example, a 4H silicon carbide substrate having one or more silicon carbide layers formed thereon (e.g., by epitaxial growth) in some embodiments. Other semiconductor layers (e.g., polysilicon layers), insulating layers and/or metal layers may be formed on the silicon carbide semiconductor layer structure to form the power MOSFETs 310.

Figure 4A:
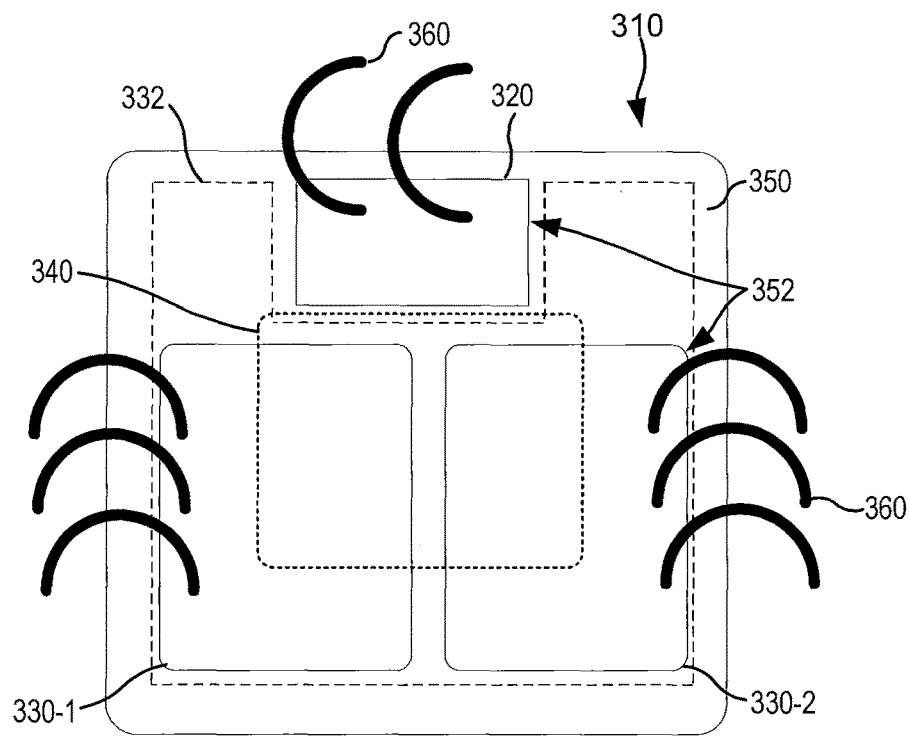
FIG. 4A is a schematic plan view of one of the power MOSFETs included on the semiconductor wafer of FIG. 3.
Figure 4B:
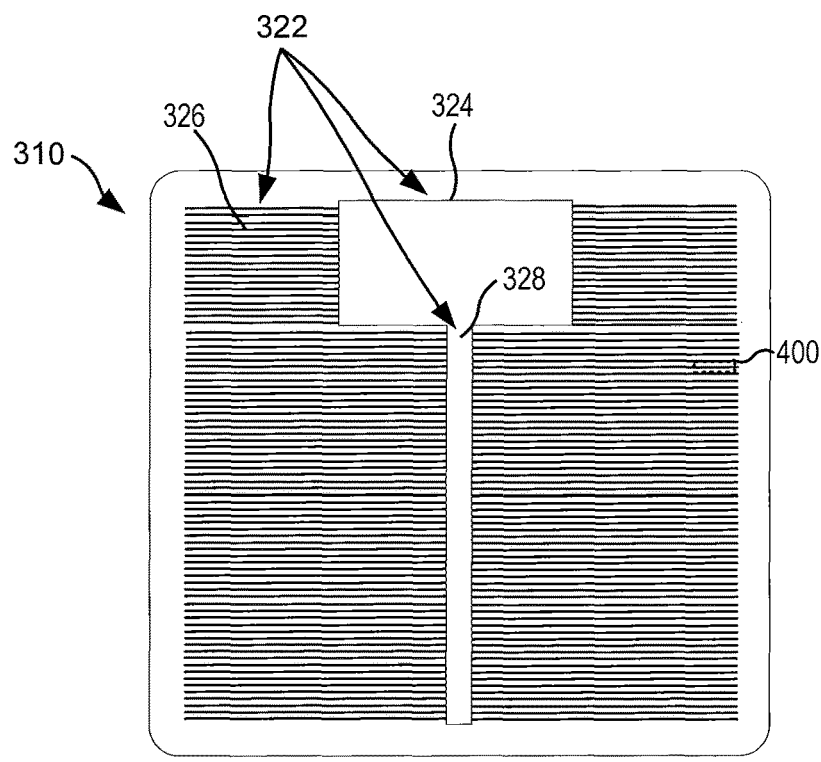
FIG. 4B is a schematic plan view of the power MOSFET of FIG. 4A with the source metallization removed.

FIG. 4A is a schematic plan view of one of the power MOSFETs 310 included on the wafer 300 of FIG. 3. FIG. 4B is a schematic plan view of the power MOSFET 310 of FIG. 4A with the source metallization and gate bond pad removed.

As shown in FIG. 4A, a gate bond pad 320 and one or more source bond pads 330-1, 330-2 may be formed on an upper surface of a semiconductor layer structure of the MOSFET 310. A drain bond pad 340 (shown by a dotted box in FIG. 4A) may be provided on the bottom side of the MOSFET 310. Each bond pad 320, 330, 340 may be formed of a metal, such as aluminum, that bond wires can be readily attached to via conventional techniques such as thermocompression or soldering.

As will be discussed in more detail below, source contacts are provided that contact source regions in the semiconductor layer structure of the MOSFET 310. The source contacts may be lower portions of a source metal pattern 332 that extends across much of the upper surface of the MOSFET 310. The source metal pattern 332 is indicated by a dashed box in FIG. 4A as significant portions of the source metal pattern 332 are covered by a protective layer 350. The source bond pads 330-1, 330-2 are portions of the source metal pattern 332 that are exposed through openings 352 in the protective layer 350. Bond wires 360 are shown in FIG. 4A that may be used to connect the gate bond pad 320 and the source bond pads 330-1, 330-2 to external circuits or the like.

As is shown in FIG. 4B, a gate electrode pattern 322 may be provided that includes a gate pad 324, a plurality of gate fingers 326, and one or more gate buses 328 that electrically connect the gate fingers 326 to the gate pad 324. The gate pad 324 may be directly underneath and electrically connected to the gate bond pad 320, and the gate fingers 326 may extend horizontally across the device. An insulating layer (not shown) may cover the gate fingers 326 and gate bus(es) 328. The source metal pattern 332 may be formed on the insulating layer over the gate fingers 326. Source contacts of the source metal pattern 332 extend downwardly through openings in the insulating layer (not shown) and between the gate fingers 326 to contact corresponding source regions in the semiconductor layer structure. The MOSFET 310 includes a plurality of unit cell transistors 400 that are arranged in parallel. The location of one unit cell 400 is shown in FIG. 4B to provide context.

Figure 5A:
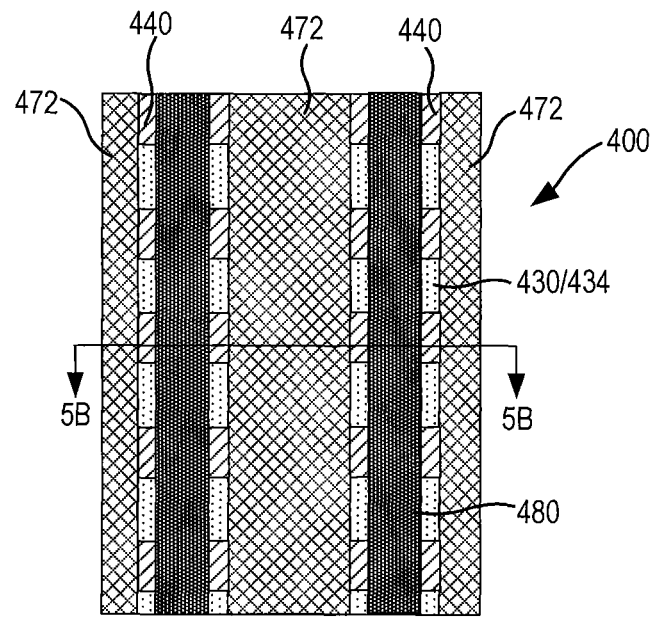
FIG. 5A is a schematic plan view of a portion of a unit cell of the power MOSFET of FIGS. 4A-4B.
Figure 5B:
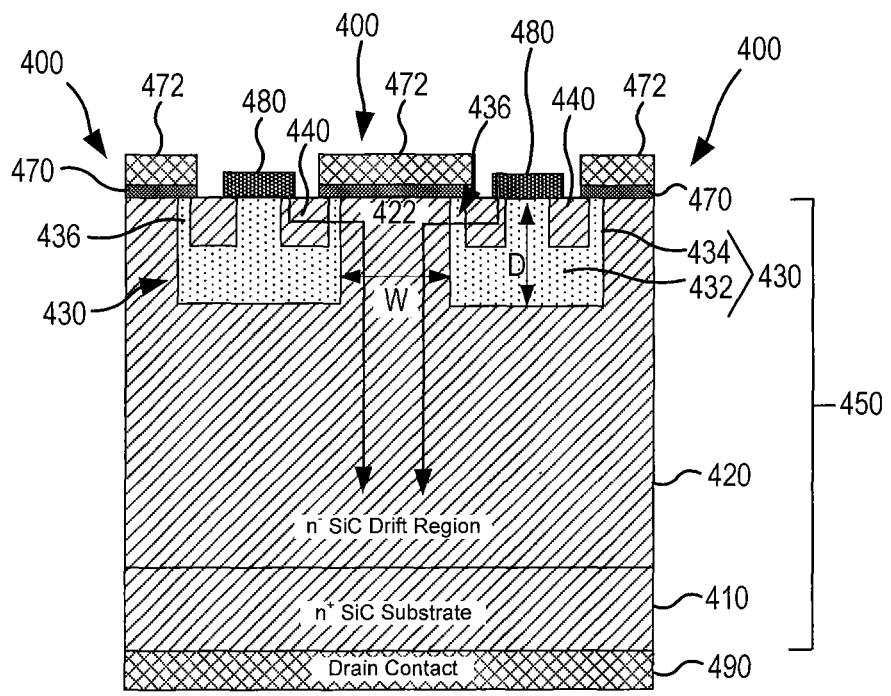
FIG. 5B is a schematic cross-sectional diagram taken along the line 5B-5B of FIG. 5A.

FIG. 5A is a schematic plan view of the unit cell transistor 400 of the power MOSFET 310 of FIGS. 4A-4B. FIG. 5B is a schematic cross-sectional diagram taken along the line 5B-5B of FIG. 5A. It will be appreciated that FIG. 5B illustrates one full unit cell 400 and portions of two additional unit cells 400 on either side thereof in order to provide context.

Referring to FIGS. 5A-5B, the unit cell transistor 400 may be formed on an n-type silicon carbide semiconductor substrate 410 such as, for example, a single crystal 4H silicon carbide semiconductor substrate that is heavily-doped with n-type impurities. The doping concentration of the substrate 410 may be, for example, between $1 \times 10^{18}$ atoms/cm$^3$ and $1 \times 10^{21}$ atoms/cm$^3$, although other doping concentrations may be used. Herein, the "doping concentration" of a semiconductor material refers to the number of dopant atoms that cause the semiconductor material to have a certain conductivity type (i.e., either n-type or p-type) that are present within a cubic centimeter of semiconductor material as measured using standard measurement techniques such as Secondary Ion Mass Spectrometry ("SIMS"). For an n-type semiconductor material, references to the doping concentration will typically refer to the concentration of n-type dopants and for a p-type semiconductor material, references to the doping concentration will typically refer to the concentration of p-type dopants, except when indicated otherwise. The substrate 410 may be any appropriate thickness (e.g., between 100 and 500 microns thick. The substrate 410 may be partially or fully removed in some embodiments.

A lightly-doped n-type (n⁻) silicon carbide drift region 420 is provided on the substrate 410. The n-type silicon carbide drift region 420 may be formed by, for example, epitaxial growth on the silicon carbide substrate 410. The n-type silicon carbide drift region 420 may have, for example, a doping concentration of $1 \times 10^{14}$ to $1 \times 10^{16}$ dopants/cm$^3$. The n-type silicon carbide drift region 420 may be a thick region, having a vertical height above the substrate 410 of, for example, 3-100 microns. While not shown in FIG. 5B, in some embodiments, an upper portion of the n-type silicon carbide drift region 420 may be more heavily doped (e.g., a doping concentration of $1 \times 10^{16}$ to $5 \times 10^{16}$ dopants/cm$^3$) than the lower portion thereof.

Figure 5C:
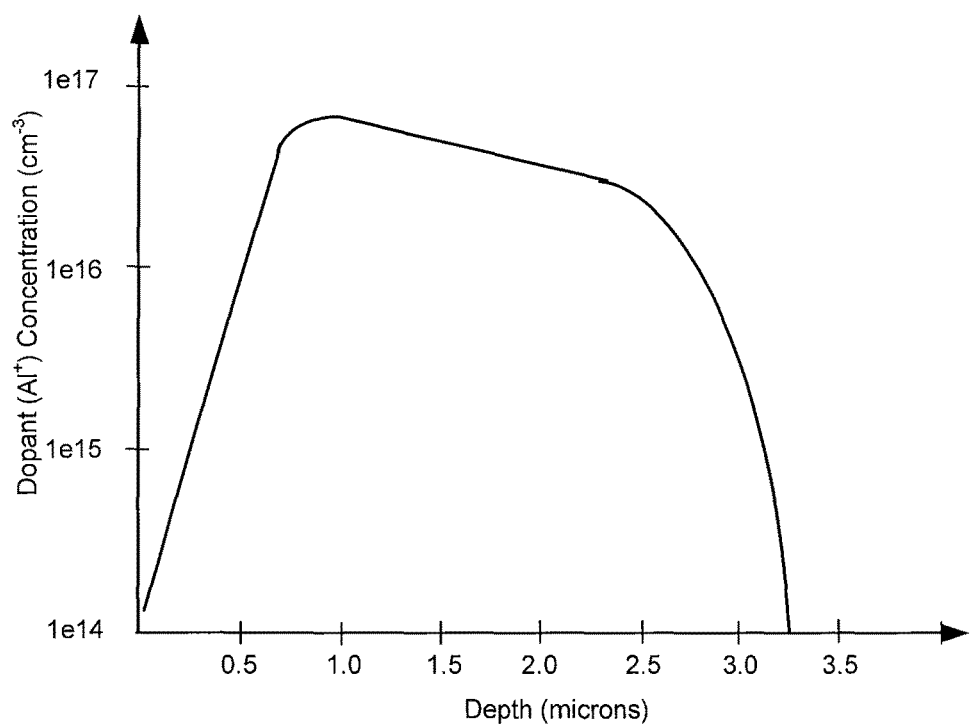
FIG. 5C is a graph showing the doping profile of the channel regions of the unit cell of FIG. 5A-5B as a function of depth.

Well regions 430 are formed in upper portions of the n-type drift layer 420. The well regions 430 include main wells 432 and side wells 434 that are on either side of the main wells 432. In some embodiments, the main wells 432 and the side wells 434 may be formed in the same process and may have the same p-type doping concentration as a function of depth. FIG. 5C is a graph showing an example doping profile of the well regions 430 for such an embodiment. In other embodiments, the side wells 434 may be more lightly doped with p-type dopants than the main wells 432 (e.g., upper portions of the main wells 432 may have a p-type dopant concentration of between $5 \times 10^{18}/cm^3$ and $5 \times 10^{19}/cm^3$, lower portions of the main wells 432 may have a p-type dopant concentration of between $1 \times 10^{18}/cm^3$ and $1 \times 10^{19}/cm^3$, while the side wells 434 may have a doping concentration as shown in FIG. 5C). After the well regions 430 are formed, heavily-doped ($n^+$) n-type silicon carbide source regions 440 may be formed in upper portions of the well regions 430. The n-type source regions 440 may be formed by ion implantation. A JFET region 422 is defined between the well regions 430 in the upper portion of the drift layer 420. The substrate 410, the drift layer 420 (including the JFET region 422), the well regions 430 and the source regions 440 may together comprise a semiconductor layer structure 450.

The well regions 430 are formed via channeled ion implantation. For example, any of the channeled ion implantation techniques disclosed in U.S. patent application Ser. No. 15/168,310, filed May 31, 2016, may be used to form the well regions 430. The entire content of U.S. patent application Ser. No. 15/168,310 is incorporated herein by reference as if set forth fully herein. The use of channeled ion implantation allows forming deep well regions 430 while at the same time using relatively low implantation energies. As a result, the surface of the semiconductor layer structure 450 may remain relatively undamaged. In addition, the deep well regions 430 protect the gate insulating layer 470 from damage during reverse blocking operation and also may improve the short-circuit capability of the device, as will be discussed in further detail below. Moreover, using the channeled ion implantation it is possible to only very lightly dope the upper portion of the semiconductor layer structure 450. In fact, in some embodiments, the concentration of p-type dopants may be below the n-type doping level of the upper portion of the n-type drift layer 420 (which may be doped n-type during the growth thereof) so that the uppermost portion of at least the side wells 434 (where the channel regions 436 are located) will exhibit n-type conductivity with a very low effective n-type dopant concentration (where the effective n-type dopant concentration is the number of n-type dopants minus the number of p-type dopants). The provision of a very lightly doped n-type channel region 436 (for at least the upper portion of the channel) may result in improved carrier mobility. For example, in some embodiments, the top 0.2 microns of the implanted portion of the semiconductor layer structure 450 may exhibit n-type conductivity (in other words, the top 0.2 microns of each well region 430 may exhibit n-type conductivity). In other embodiments, the top 0.5 microns of the implanted portion of the semiconductor layer structure 450 may exhibit n-type conductivity. In still other embodiments, the top 0.7 microns of the implanted portion of the semiconductor layer structure 450 may exhibit n-type conductivity. In still other embodiments, the top 1.0 microns of the implanted portion of the semiconductor layer structure 450 may exhibit n-type conductivity. In other embodiments, the side wells 434 may have one of the above-described doping profiles with at least the top 0.2, 0.5, 0.7 or 1.0 microns of the side wells 434 exhibiting n-type conductivity, while the main wells 432 may have different doping profiles than the side wells 434 (e.g., the main wells may not include any portions having n-type conductivity).

In some embodiments, the main wells 432 and the side wells 434 may be formed in a single channeled ion implantation step. In other embodiments, the main wells 432 and the side wells 434 may be formed in separate channeled ion implantation steps. The main wells 432 and the side wells 434 may be formed using any of the channeled ion implantation techniques disclosed in the aforementioned U.S. patent application Ser. No. 15/168,310. The regions 430 are referred to herein as "well regions" as opposed to "p-wells" as the well regions 430 may include first portions having n-type conductivity and second portions having p-type conductivity.

When channeled ion implantation is used, the dopant ions may be implanted much deeper into the semiconductor layer structure 450 using relatively low implantation energies. Since low implantation energies are used, the damage to the upper surface of the semiconductor layer structure 450 that is caused by the ion implantation may be reduced. Such damage, particularly when the damage is near the upper surface of the semiconductor layer structure 450 underneath the gate insulating layer 470, may reduce the mobility of the carriers in the channel regions 436. Since the low-energy channeled ion implant will cause less damage than a conventional implant, the mobility of the carriers may be enhanced, resulting in faster switching times for a given threshold voltage.

In addition, the channeled ion implant allows the formation of deep well regions 430. For example, using channeled ion implants it is possible to readily form extremely deep well regions 430 that have depths of, for example, about 3 microns (or more) into the semiconductor layer structure 450 using relatively modest implant energies such as implant energies of about 700 keV. The deep well regions 430 improve the short circuit capability of the MOSFET 310.

The provision of deeper well regions 430 allows the width of the JFET region 422 to be increased. This reduces the resistance in the JFET region 422, and hence may improve the on-state performance of the MOSFET 310. In some embodiments, the depth (D) of each well regions 430 may exceed the width (W) of the JFET region 422. In other embodiments, the depth of each well region 430 may be at least 1.25 times the width of the JFET region 422. In still other embodiments, the depth of each well region 430 may be at least 1.5 times the width of the JFET region 422. In yet additional embodiments, the depth of each well region 430 may be at least twice the width of the JFET region 422. In each of the above cases, the depth of each well region 430 may be less than four times the width of the JFET region 422.

In some embodiments, the well regions 430 may have a depth of at least 1.5 microns, where the depth of each well region 436 is the vertical height of the well region along an axis that is perpendicular to an upper surface of the semiconductor substrate 410. In other embodiments, the well regions 430 may have a depth of at least 2.0 microns. In further other embodiments, the well regions 430 may have a depth of at least 2.5 microns. In still other embodiments, the well regions 430 may have a depth of at least 3.0 microns. In each of the above cases, the depth of the well regions 430 may be less than 6.0 microns. In an example embodiment, the depth of the well regions 430 may be about 3 microns and the width of the JFET region may be about 2.4 microns.

After the n-type source regions 440 are formed, a gate insulating pattern 470 may be formed on the upper surface of the semiconductor layer structure 450. The gate insulating pattern 470 may be formed directly on the semiconductor layer structure 450 with no intervening n-type epitaxial layer. The gate insulating pattern 470 may comprise, for example, a silicon oxide pattern, although other insulating materials may be used. A gate electrode 472 is formed on the gate insulating pattern 470. The gate electrode 472 may comprise, for example, a conductive gate finger that serves as a gate electrode for a plurality of the unit cell transistors 400.

Source contacts 480 may be formed on the heavily-doped n-type source regions 440 and the well regions 430. While not shown to simplify the drawing, the source contacts 480 may be part of a continuous source pattern 332 that extends across the upper surface of the silicon carbide semiconductor layer structure of the MOSFET 310 (see FIG. 4A). The source contacts 480 may comprise, for example, metals such as nickel, titanium, tungsten and/or aluminum, and/or alloys and/or thin layered stacks of these and/or similar materials. A drain contact 490 may be formed on the lower surface of the substrate 410. The drain contact 490 may comprise, for example, similar materials to the source contact, as this forms an ohmic contact to the silicon carbide substrate.

Channel regions 436 are formed in the side wells 434. The channel regions 436 electrically connect the n-type source regions 440 to the JFET region 422 when a sufficient bias voltage is applied to the gate electrode 472. Since the well regions 430 are formed using channeled ion implantation, the channel regions 436 that are a portion of the well regions 430 are also formed via channeled ion implantation. When such a bias voltage is applied to the gate electrode 472, current may flow from the n-type source regions 440 through the channel regions 436 to the JFET region 422 and down to the drain contact 490 as is shown by the bold arrows in FIG. 5B.

FIG. 5C is a graph showing the (p-type dopant) doping profile of a side well 434 of the unit cell transistor 400 as a function of depth from a top surface of the semiconductor layer structure 450. As shown in FIG. 5C, the p-type dopant concentration at the surface of the channel region 436 may be very low, under $1\times10^{15}/cm^3$. The p-type dopant concentration sharply increases throughout the first 0.9 microns to a peak doping concentration of about $8\times10^{16}/cm^3$ at a depth of about 0.9 microns from the top surface of the semiconductor layer structure 450. The doping concentration then very gradually decreases to a doping concentration of about $3\times10^{16}/cm^3$ at a depth of about 2.8 microns. The doping concentration then decrease rapidly, falling below the detection level by a depth of 3.5 microns. The doping profile of FIG. 5C may be achieved using a channeled ion implant of $Al^+$ ions at a dose of $1\times10^{13}/cm^3$ where the impurities are implanted at an angle that is within +/−1.5° of one of the <0001>, <11-23>, <-1-123>, <1-213>, <-12-13>, <2-1-13> or <-2113> crystallographic axes of the 4H silicon carbide drift layer 420 at room temperature. Any appropriate dopant ions may be used. In some embodiments, the implantation may be performed at different temperatures such as, for example, temperatures of 75° C. or more. The specific profile depicted in FIG. 5C was achieved be performing the channeled ion implant along the <0001> crystallographic axis of the 4H silicon carbide drift layer 420.

As grown, the upper portion of the drift region 420 may have a doping concentration of, for example, between $1\times10^{16}/cm^3$ and $5\times10^{17}/cm^3$. In some embodiments, the doping concentration may be between $2\times10^{16}/cm^3$ and $5\times10^{16}/cm^3$. Thus, as can be seen from FIG. 5C, the top 0.7-0.8 microns of each side well 434 (and in some embodiments the entire well region 430 exclusive of the n-type source regions 440) may have n-type conductivity despite the implantation of p-type dopants, since the background doping level of the semiconductor layer is higher than the doping level of the ion implantation in the top portions of the side wells 434. Thus, in effect, the equivalent of the n-type epitaxial layer 160 of unit cell transistor 100 is formed in unit cell transistor 400 but in a much simpler manner. The n-type region that is provided in the upper portion of each side well 434 may have a low doping concentration and hence may exhibit very high carrier mobility.

Figure 6:
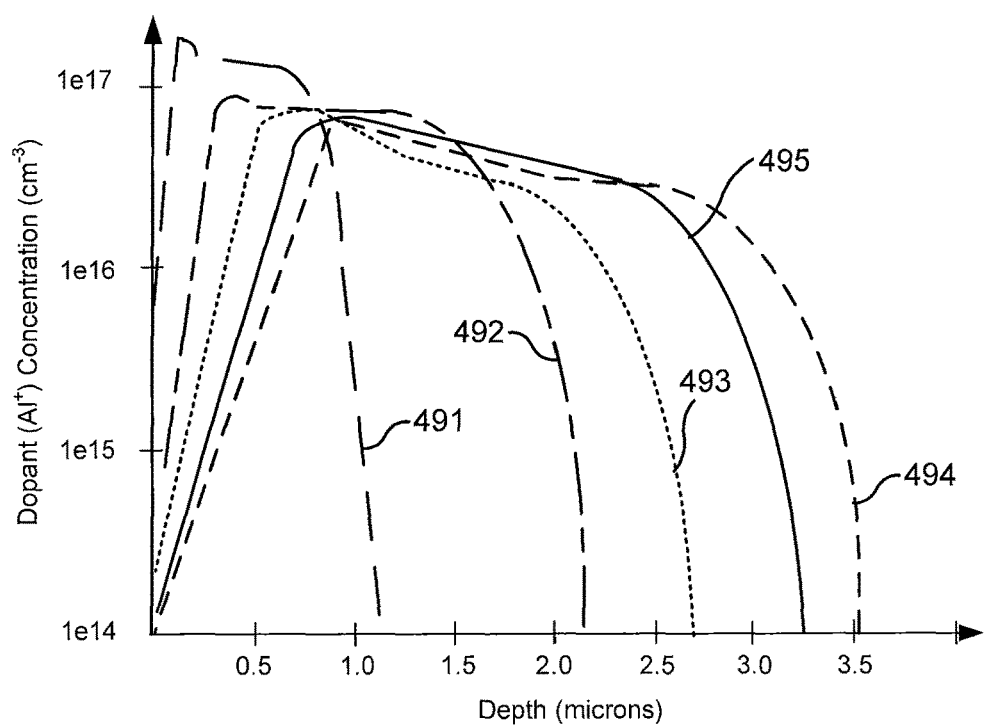
FIG. 6 is a graph showing example doping profiles for the well regions of the unit cell of FIGS. 5A-5B that may be achieved using channeled ion implants performed at various implantation energies.

While FIG. 5C shows one example doping profile for the well regions 430 that may be achieved when the well regions 430 are formed via channeled ion implantation, it will be appreciated that a wide variety of different doping profiles may be achieved. For example, FIG. 6 is a graph showing doping profiles that may be achieved using channeled ion implants performed under the same conditions as discussed above with respect to FIG. 5C but at different implantation energies. In particular, in FIG. 6, curves 491-494 represent the doping profiles obtained when the ion implantation is performed at implantation energies of 100 keV, 300 keV, 500 keV and 900 keV, respectively, along the <0001> crystallographic axis of the 4H silicon carbide drift layer. For comparison purposes, FIG. 6 also includes the doping profile of FIG. 5C which is labelled as curve 495, which corresponds to an implantation energy of 700 keV.

Figure 7:
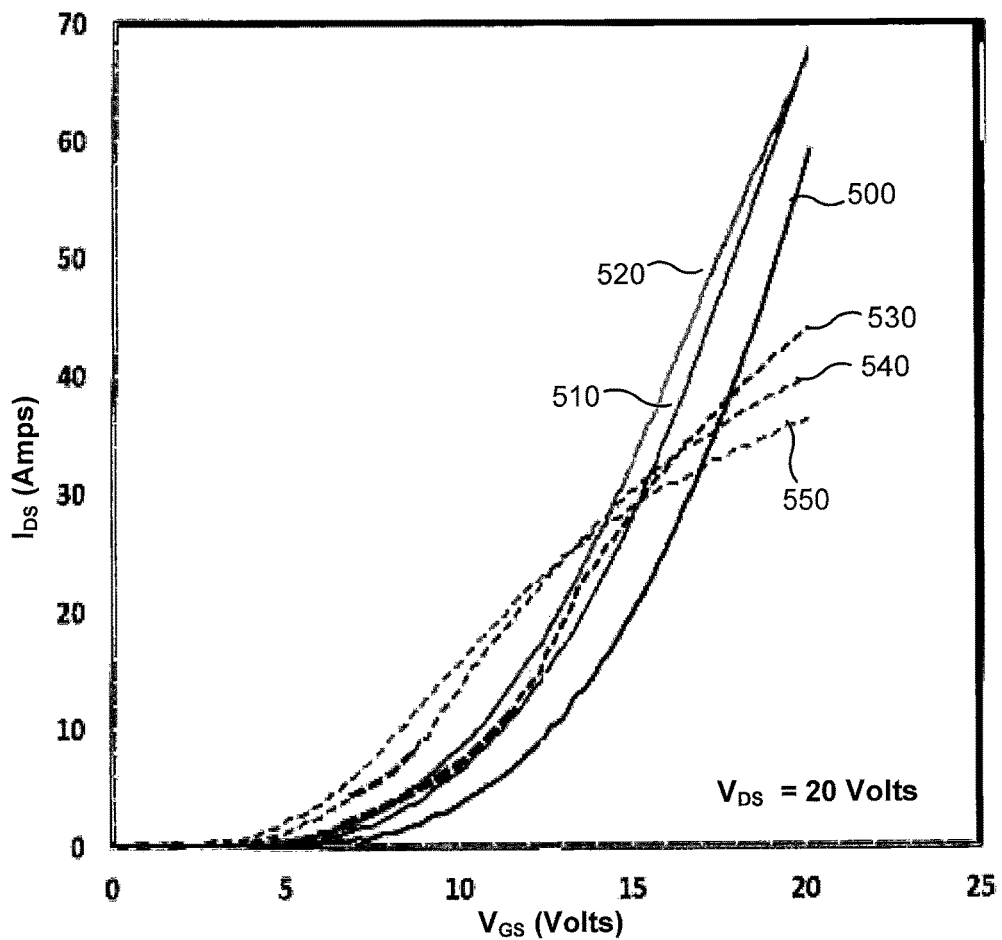
FIG. 7 is a graph of the transfer curves for a silicon carbide MOSFET according to embodiments of the present invention.

Some MOSFETs according to embodiments of the present invention may exhibit a zero-temperature coefficient ("ZTC") point their transfer characteristics over temperature. FIG. 7 is a graph that compares the transfer curves for a conventional power MOSFET having the unit cell transistors 200 of FIG. 2A at three different operating temperatures to the equivalent transfer curves for a power MOSFET having the unit cell transistors 200 of FIG. 5B at the same three operating temperatures.

The solid curves 500, 510, 520 in FIG. 7 represent the drain current as a function of the gate-to-source voltage $V_{GS}$ for a conventional power MOSFET having the unit cell transistors 200 of FIG. 2A. Each solid curve 500, 510, 520 is plotted for a drain-to-source voltage $V_{DS}$ of 20 Volts. Curve 500, 510, 520 show the drain current as a function of gate voltage for operating temperatures of 25° C., 100° C. and 150° C., respectively. As can be seen in FIG. 7, the drain current $I_{DS}$ increases more quickly the higher the temperature. This shows that, at least for the range of drain currents shown in FIG. 7, the conventional MOSFET has a positive temperature coefficient of the threshold voltage. Since the higher drain currents result in increased power consumption (since P=V*I), under short circuit conditions the MOSFET will experience a feedback loop with the increased drain current $I_{DS}$ and corresponding increase in power raising the temperature which results in further increase in the drain current $I_{DS}$. This can result in very short duration short circuit capabilities for the MOSFET.

A negative temperature coefficient for the drain current means that curves of the drain current $I_{DS}$ of a MOSFET as a function of the gate-to-source voltage $V_{GS}$ (for a fixed drain-to-source voltage $V_{DS}$) at two different operating temperatures cross. This can be seen with reference to FIG. 7. The dashed curves 530, 540, 550 in FIG. 7 represent the drain current $I_{DS}$ as a function of the gate-to-source voltage $V_{GS}$ for a MOSFET according to embodiments of the present invention that has a negative temperature coefficient for the drain current. Again, each dashed curve 530, 540, 550 is plotted for a drain-to-source voltage $V_{DS}$ of 20 Volts. Curves 530, 540, 550 show the drain current as a function of gate voltage for temperatures of 25° C., 100° C. and 150° C., respectively. As can be seen in FIG. 7, when the MOSFET has a negative temperature coefficient for the drain current, the curves cross each other (here the curves cross at gate voltages of about 15 volts), so that above this gate voltage level the drain current $I_{DS}$ saturates more quickly the higher the temperature. Thus, as the temperature increases, the drain current $I_{DS}$ decreases and the above-described feedback loop is not created. Thus, MOSFETs according to embodiments of the present invention that have a negative temperature coefficient for the drain current may exhibit improved short circuit capabilities.

Notably, the MOSFETs according to embodiments of the present invention exhibit a negative temperature coefficient for the drain current within the specified operating conditions for the device (i.e., when the MOSFET is operated at values of $V_{GS}$, $V_{DS}$ and $I_{DS}$ that are within the specified operating conditions for the device). In some embodiments, the MOSFETs may exhibit a negative temperature coefficient for the drain current with respect to operating temperatures of 25° C. and 150° C. at drain currents of less than 50 Amps. In other embodiments, the MOSFETs may exhibit a negative temperature coefficient for the drain current with respect to operating temperatures of 25° C. and 150° C. at drain currents of less than 40 Amps. In still other embodiments, the MOSFETs may exhibit a negative temperature coefficient for the drain current with respect to operating temperatures of 25° C. and 150° C. at drain currents of less than 35 Amps, or less than 30 Amps.

Figure 8:
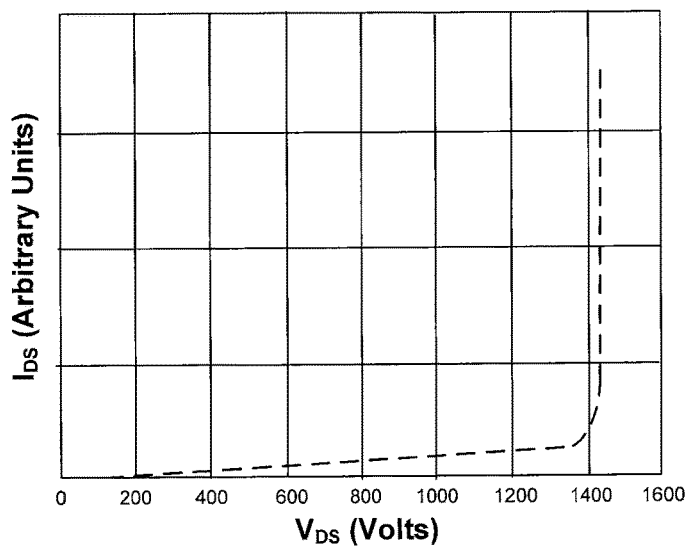
FIG. 8 is a graph illustrating the voltage blocking characteristics, respectively, of the power MOSFET of FIGS. 4A-4B.

The MOSFETs according to embodiments of the present invention may achieve the improved short circuit capability without sacrificing other performance parameters. For example, FIG. 8 is a graph illustrating the voltage blocking characteristics of a MOSFET formed using the unit cells 400 discussed above. As can be seen, the MOSFET exhibits a high voltage blocking level.

Figure 9A:
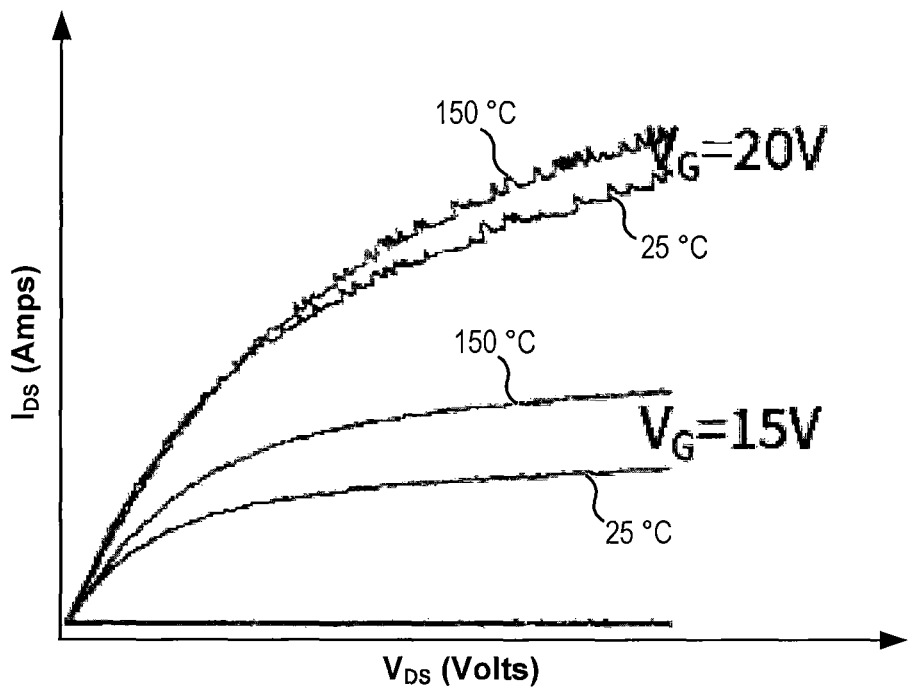
FIGS. 9A and 9B are graphs illustrating the output characteristics of a conventional MOSFET and a MOSFET according to embodiments of the present invention.
Figure 9B:
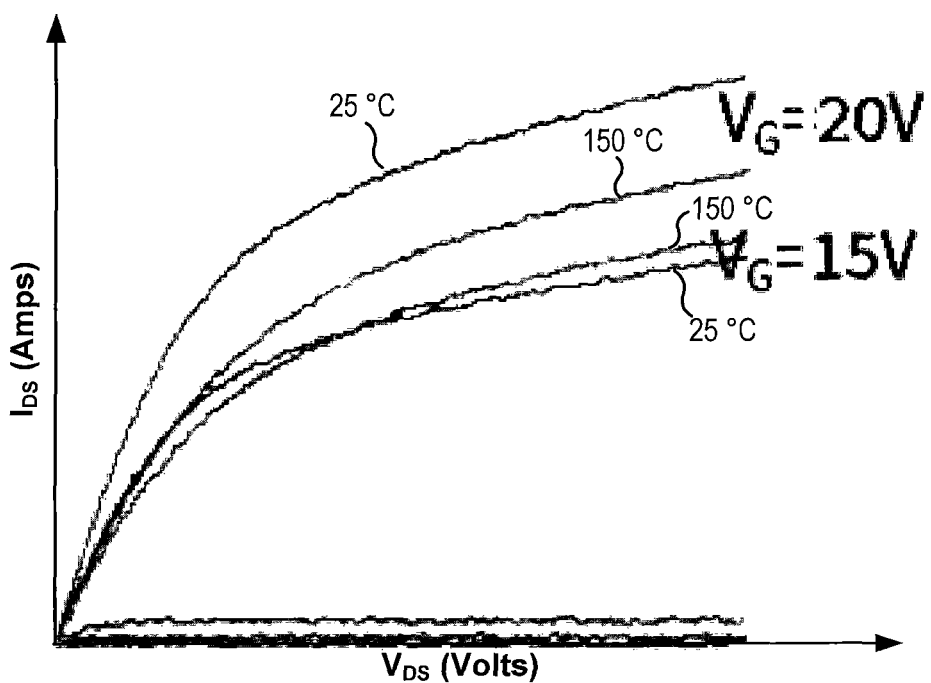

FIGS. 9A and 9B are graphs illustrating the output characteristics of a conventional MOSFET and a MOSFET according to embodiments of the present invention, respectively.

As can be seen by comparing FIGS. 9A and 9B, the forward conduction voltage drop for both devices is similar. FIG. 9A also shows how the conventional MOSFET has a positive temperature coefficient of the threshold voltage, while FIG. 9B shows that the MOSFET according to embodiments of the present invention has a negative temperature coefficient for the drain current.

Figure 10:
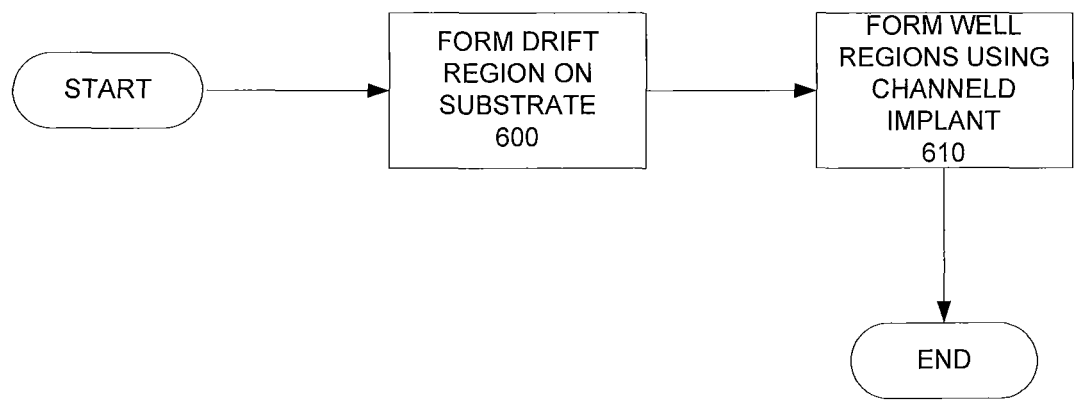
FIG. 10 is a flow chart of a method of forming a power MOSFET according to embodiments of the present invention.

FIG. 10 is a flow chart of a method of forming a power MOSFET according to embodiments of the present invention. As shown in FIG. 10, operations may begin with the formation of a silicon carbide drift region on a substrate (Block 600). The silicon carbide drift region may have a first conductivity type. Next, first and second well regions may be formed in an upper portion of the silicon carbide drift region by implanting second conductivity type dopants into the upper portion of the silicon carbide drift region using a channeled ion implantation (Block 610). An upper portion of each of the first and second well regions may have the first conductivity type, while a lower portion of each of the first and second well regions may have the second conductivity type, where the second conductivity type being different than the first conductivity type. The first and second well regions may be adjacent to each other and may define a JFET region therebetween. The depth of the first well region may exceed a distance between the first and second well regions (i.e., may exceed a width of the JFET region).

The MOSFETs according to embodiments of the present invention may have significantly improved short circuit capabilities while otherwise providing equivalent or improved operating characteristics such as blocking voltage capabilities and forward threshold voltage. By using channeled ion implantation techniques to form the well regions, a relatively thick, lightly doped n-type region may be formed underneath the gate electrode which results in a channel having high mobility. The channeled ion implants may also provide favorable doping profiles, with low p-type doping levels near the surface and much higher p-type doping levels deeper in the well regions. Additionally, the channeled ion implantation tends to have low levels of damage, particularly at the implantation surface, since the ions tends to flow down channels in the crystallographic structure of the semiconductor layer and hence have relatively low levels of collision near the surface. This reduced surface damage also may improve the mobility of the carriers in the channel region. Furthermore, the channeled ion implant allows formation of a deep well region, such as a well region having a depth of greater than 1.5 microns. In some embodiments, the well regions may have a depth of 2 microns, 3 microns or even more. The deeper well regions allows for JFET regions having expanded widths, which reduces the resistance of the JFET region and hence improves the short circuit capability of the device.

While the above discussion focuses on n-channel MOSFETs, it will be appreciated that pursuant to further embodiments of the present invention, the polarity of each of the semiconductor layers in each device could be reversed so as to provide corresponding p-channel MOSFETs. Likewise, while the embodiments of the present invention discussed above are MOSFETs, it will be appreciated that the techniques disclosed herein may also be used to form insulated gate bipolar junction transistors (IGBTs) that include a MOSFET according to embodiments of the present invention.

Herein, embodiments of the present invention are described with respect to cross-sectional diagrams that show one or two unit cells of a power switching devices. It will be appreciated that actual implementations will typically include a much larger number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of forming a MOSFET, the method comprising:
   providing a silicon carbide drift region that has a first conductivity type; and
   implanting second conductivity type dopants into an upper portion of the silicon carbide drift region using channeled ion implantation to form first and second well regions in the upper portion of the silicon carbide drift region,
   wherein an upper portion of each of the first and second well regions has the first conductivity type while a lower portion of each of the first and second well regions has the second conductivity type, the second conductivity type being different than the first conductivity type, and
   wherein at least an upper 0.2 microns of the first well region has the first conductivity type.

2. The method of claim 1, wherein the first and second well regions each have a depth of at least 1.5 microns.

3. A method of forming a MOSFET, the method comprising:
   providing a silicon carbide drift region that has a first conductivity type; and
   implanting second conductivity type dopants into an upper portion of the silicon carbide drift region using channeled ion implantation to form first and second well regions in the upper portion of the silicon carbide drift region,
   wherein an upper portion of each of the first and second well regions has the first conductivity type while a lower portion of each of the first and second well regions has the second conductivity type, the second conductivity type being different than the first conductivity type, and
   wherein a depth of the first well region exceeds a distance between the first and second well regions.

4. The method of claim 3, wherein the first and second well regions each have a depth of at least 2.0 microns.

5. A method of forming a MOSFET, the method comprising:
   providing a silicon carbide drift region that has a first conductivity type; and implanting second conductivity type dopants into an upper portion of the silicon carbide drift region using channeled ion implantation to form first and second well regions in the upper portion of the silicon carbide drift region, wherein an upper portion of each of the first and second well regions has the first conductivity type while a lower portion of each of the first and second well regions has the second conductivity type, the second conductivity type being different than the first conductivity type, and wherein a side portion of the first well region that is underneath a gate electrode of the MOSFET comprises a channel region, and wherein at least a portion of the channel region has the first conductivity type.

6. The method of claim 5, wherein the channel region is formed using channeled ion implantation.

7. The method of claim 5, wherein the channel region and a central portion of the first well region have substantially the same doping profile of second conductivity type dopants as a function of depth from an upper surface of the silicon carbide drift region.

8. The method of claim 1, wherein the channeled ion implantation implants dopant impurities at an angle that is within +1-1.5° of one of the <0001>, <11-23>, <-1-123>, <1-213>, <-12-13>, <2-1-13> or <-2113> crystallographic axes of the silicon carbide drift region.

9. A method of forming a MOSFET, the method comprising:

forming a silicon carbide drift region having a first conductivity type;

forming a first well region located in an upper portion of the silicon carbide drift region and extending to an upper surface of the silicon carbide drift region, the first well region doped with second conductivity type dopants and at least a lower portion of the first well region having a second conductivity type, wherein the second conductivity type is different than the first conductivity type, and wherein the first well region comprises a channel region having the first conductivity type in an upper portion of the channel region;

forming a second well region in the upper portion of the silicon carbide drift region and extending to the upper surface of the silicon carbide drift region, the second well region doped with the second conductivity type dopants and at least a lower portion of the second well region having the second conductivity type, the first and second well regions defining a JFET region therebetween; and forming a gate insulating layer on the upper portion of the channel region, wherein a doping density of the silicon carbide drift region, a width of the JFET region, a doping density of the channel region, and/or a depth of the first well region are selected to produce a negative temperature coefficient for a drain current for at least temperatures in a range of 25–150° C. at drain-source currents of less than 40 Amps.

10. The method of claim 9, wherein the depth of the first well region is at least 1.5 microns, and wherein the depth of the first well region exceeds a distance between the first well region and the second well region.

11. The method of claim 9, wherein at least an upper 0.2 microns of the first well region has the first conductivity type.

12. The method of claim 9, wherein the channel region and a central portion of the first well region have a substantially same doping profile of the second conductivity type dopants as a function of depth from the upper surface of the silicon carbide drift region.

13. The method of claim 9, wherein forming the first well region comprises performing a channeled ion implantation at an angle that is within +1-1.5° of one of the <0001>, <11-23>, <-1-123>, <1-213>, <-12-13>, <2-1-13> or <-2113> crystallographic axes of the silicon carbide drift region.

14. The method of claim 9, wherein the channel region is formed using channeled ion implantation.

15. The method of claim 9, wherein a concentration of second conductivity type dopants in the first well region varies by less than a factor of three at depths between 1.0 and 2.0 microns from the upper surface of the silicon carbide drift region.

16. The method of claim 9, wherein a lower portion of the channel region has the second conductivity type.

17. The method of claim 1, wherein a concentration of second conductivity type dopants in the first well region varies by less than a factor of three at depths between 1.0 and 2.0 microns from an upper surface of the silicon carbide drift region.

18. The method of claim 5, wherein an upper portion of the channel region has the first conductivity type and a lower portion of the channel region has the second conductivity type.

19. The method of claim 3, wherein the first and second well regions each have a depth of at least 1.5 microns.

20. The method of claim 3, wherein the channeled ion implantation implants dopant impurities at an angle that is within +1-1.5° of one of the <0001>, <11-23>, <-1-123>, <1-213>, <-12-13>, <2-1-13> or <-2113> crystallographic axes of the silicon carbide drift region.

* * * * *

UNITED STATES PATENT AND TRADEMARK OFFICE
CERTIFICATE OF CORRECTION

PATENT NO. : 11,164,967 B2  
APPLICATION NO. : 16/538229  
DATED : November 2, 2021  
INVENTOR(S) : Zhang et al.

Page 1 of 1

It is certified that error appears in the above-identified patent and that said Letters Patent is hereby corrected as shown below:

In the Specification

Column 8, Lines 8-9: Please delete the paragraph break between "power" and "MOSFET"

Column 15, Lines 45-47: Please delete the paragraph break between "respectively." and "As"

In the Claims

Column 19, Line 25, Claim 8: Please correct "+1-1.5°" to read -- +/- 1.5° --

Column 20, Line 22, Claim 13: Please correct "+1-1.5°" to read -- +/- 1.5° --

Column 20, Line 48, Claim 20: Please correct "+1-1.5°" to read -- +/- 1.5° --

Signed and Sealed this  
Twenty-sixth Day of April, 2022

Katherine Kelly Vidal  
*Director of the United States Patent and Trademark Office*